United States Patent [19]

Okumura

[11] Patent Number: 4,877,750
[45] Date of Patent: Oct. 31, 1989

[54] METHOD OF FABRICATING A TRENCH CAPACITOR CELL FOR A SEMICONDUCTOR MEMORY DEVICE

[75] Inventor: Yoshinori Okumura, Hyogo, Japan

[73] Assignee: Mitsubishi Denki Kabushiki Kaisha, Tokyo, Japan

[21] Appl. No.: 254,836

[22] Filed: Oct. 7, 1988

[30] Foreign Application Priority Data

Nov. 17, 1987 [JP] Japan .................... 62-291349

[51] Int. Cl.$^4$ ........................................ H01L 21/306
[52] U.S. Cl. ...................................... 437/47; 437/52; 437/60; 437/203; 357/23.6
[58] Field of Search ................... 437/47, 60, 203, 228; 156/643, 644, 659.1; 357/23.6, 51, 55

[56] References Cited

U.S. PATENT DOCUMENTS

| | | | |
|---|---|---|---|
| 4,683,643 | 8/1987 | Nakajima et al. | 357/23.4 |
| 4,704,368 | 11/1987 | Goth et al. | 437/60 |
| 4,741,802 | 3/1988 | Okumura | 437/228 |
| 4,786,953 | 11/1988 | Morie et al. | 357/23.4 |

FOREIGN PATENT DOCUMENTS 0186875 7/1986 European Pat. Off. .
2075752 9/1981 United Kingdom .

Primary Examiner—Brian E. Hearn
Assistant Examiner—Tom Thomas
Attorney, Agent, or Firm—Lowe, Price, LeBlanc, Becker & Shur

[57] ABSTRACT

A novel method of fabricating a trench capacitor cell for a semiconductor device is disclosed. The method comprises:

forming a trench in a semiconductor substrate;

forming a first insulating layer on the side and bottom walls of the trench and forming a first conductor layer on the first insulating layer;

filling the trench with a second insulating layer;

forming a mask coating over the upper surface of the substrate using a material that can be removed by etching for the first conductor layer;

etching selectively the portion of the mask coating over the second insulating layer within the trench;

removing the second insulating layer out of the trench;

etching the first conductor layer from the bottom of the trench as well as the mask coating; and forming a third insulating layer on the first conductor layer in the trench and fill the trench with a second conductor layer.

7 Claims, 6 Drawing Sheets

METHOD OF FABRICATING A TRENCH CAPACITOR CELL FOR A SEMICONDUCTOR MEMORY DEVICE

BACKGROUND OF THE INVENTION

1. Field of the Invention

This invention relates to a method of fabricating a trench capacitor cell for a semiconductor device, and more particularly to an improved method of fabricating a trench capacitor cell suitable for a dynamic MOS memory device.

2. Description of the Prior Art

In order to show the background of the invention, a typical prior art process for making a trench capacitor cell is illustrated in FIGS. 3A–3F.

Referring first to FIG. 3A, the capacitor cell fabrication starts with anisotropically etching a trench 1a in a semiconductor substrate 1 of one conductivity type. An oxide layer 2 is deposited on the upper surface of the substrate including the walls of the trench 1a by means of thermal oxidation, and then, a contact hole or opening 2a is made in the oxide layer 2. Through the opening 2a, impurity ions of the conductivity type opposite the substrate are implanted to create a diffusion region 4. Subsequent to the ion implant, a polysilicon layer 3 of the conductivity type opposite the substrate is applied over the oxide layer 2.

In FIG. 3B, a resist 5 is shown positioned over the substrate 1 and filling the trench 1a. The resist 5 is then patterned by a mask and etch process to expose the trench 1a as shown in FIG. 3C. In the next step, using the resist 5 as the mask, anisotropical etching is carried out on a polysilicon layer 3 to remove only the portion thereof lying at the bottom of the trench (FIG. 3D). After the anisotropic etching, the resist 5 is entirely stripped (FIG. 3E). A relatively thin layer of oxide 6 is developed on the polysilicon layer 3. Another polysilicon layer 7 covers the oxide layer 6 and fills the trench as shown in FIG. 3F, thereby completing a trench capacitor cell which stores charge between the two polysilicon layers 3 and 7.

One problem of the prior art fabricating process discussed above is that the resist 5 fills the trench 1a and form a plug-like downward extension 5a far greater in vertical dimension than the rest of the resist 5 as shown in FIG. 3B. When the resist 5 is masked and etched by photolithography to form an opening over the trench 1a through which subsequent anisotropic etching is performed, the plug-like extension 5a of the resist can not be completely removed, leaving its remnants within the trench. When anisotropic etching is performed to remove the polysilicon layer 3 from the trench bottom, the oxide remnants within the trench have an adverse effect of retarding the anisotropic etching action on the polysilicon. As a result, the complete removal of the polysilicon from the trench bottom, thus the complete trench isolation of the device is not successfully effected.

SUMMARY OF THE INVENTION

Therefore, it is an object of this invention to provide an improved method of fabricating a trench capacitor cell for a semiconductor device with higher reliability of trench isolation.

A method of fabricating a trench capacitor cell for a semiconductor device according to this invention includes the following steps:

(1) Form a trench in a semiconductor substrate, a first insulating layer on the side and bottom walls of the trench, and a first conductor layer on the first insulating layer;

(2) Fill the trench with a second insulating layer;

(3) Form a pseudo-mask over the upper surface of the substrate using a material that can be removed by etching for the first conductor layer;

(4) Etch away the portion of the pseudo-mask over the second insulating layer within the trench;

(5) Remove a second insulating layer out of the trench;

(6) Etch the portion of the first conductor layer lying on the trench bottom as well as the pseudo-mask using the pseudo-mask as a temporary coating; and (7) Form a third insulating layer on the first conductor layer in the trench and fill the trench with a second conductor layer.

According to a preferred embodiment of the invention, a second step in the fabricating method is preferably carried out by forming the second insulating layer over the upper surface of the substrate and within the trench, applying a layer of resist over the second insulating layer, and etching the resist and the second insulating layer away from the substrate surface, so that a portion of the second insulating layer is left within the trench. The fourth step is preferably effected by applying a layer of resist over the pseudo-mask, patterning the resist layer to remove the portion thereof overlying the trench, selectively etching the pseudo-mask through the resist layer, and removing all the resist layer. The sixth step may preferably is done using standard anisotropic etching. The first step preferably includes additional steps of forming impurity diffusion regions in the upper surface of the substrate, and making contact holes in the first insulating layer at locations over the impurity diffusion regions. The first conductor layer is preferably formed so that it makes contact with the diffusion regions through the contact holes.

The pseudo-mask is preferably made of polysilicon, amorphous silicon or nitride oxide. The second insulating layer is preferably a layer of silicon oxide.

In the fabricating process of the invention, when the first insulating layer is selectively etched away from the trench bottom to effect the desired isolation, it is performed without using a coating of resist as in the prior art. Instead, use is made of pseudo-mask formed of a material which is removable by the etching technique used to selectively strip the first insulating layer. The problem of the prior art process is thus effectively overcome that fractions of the resist material remain within the trench after the removal of the resist and tend to have a retarding effects on subsequent etching of the insulating layer away from the trench bottom, resulting in poor or insufficient isolation. Reliable fabrication of trench capacitor cell is thus realized and assured according to this invention.

The present invention itself, however, as well as other objects, features, aspects and advantages thereof will become more apparent from the following detailed description of the present invention when taken in conjunction with the accompanying drawings.

DETAILED DESCRIPTION OF THE PREFERRED EMBODIMENTS

Figure 1:
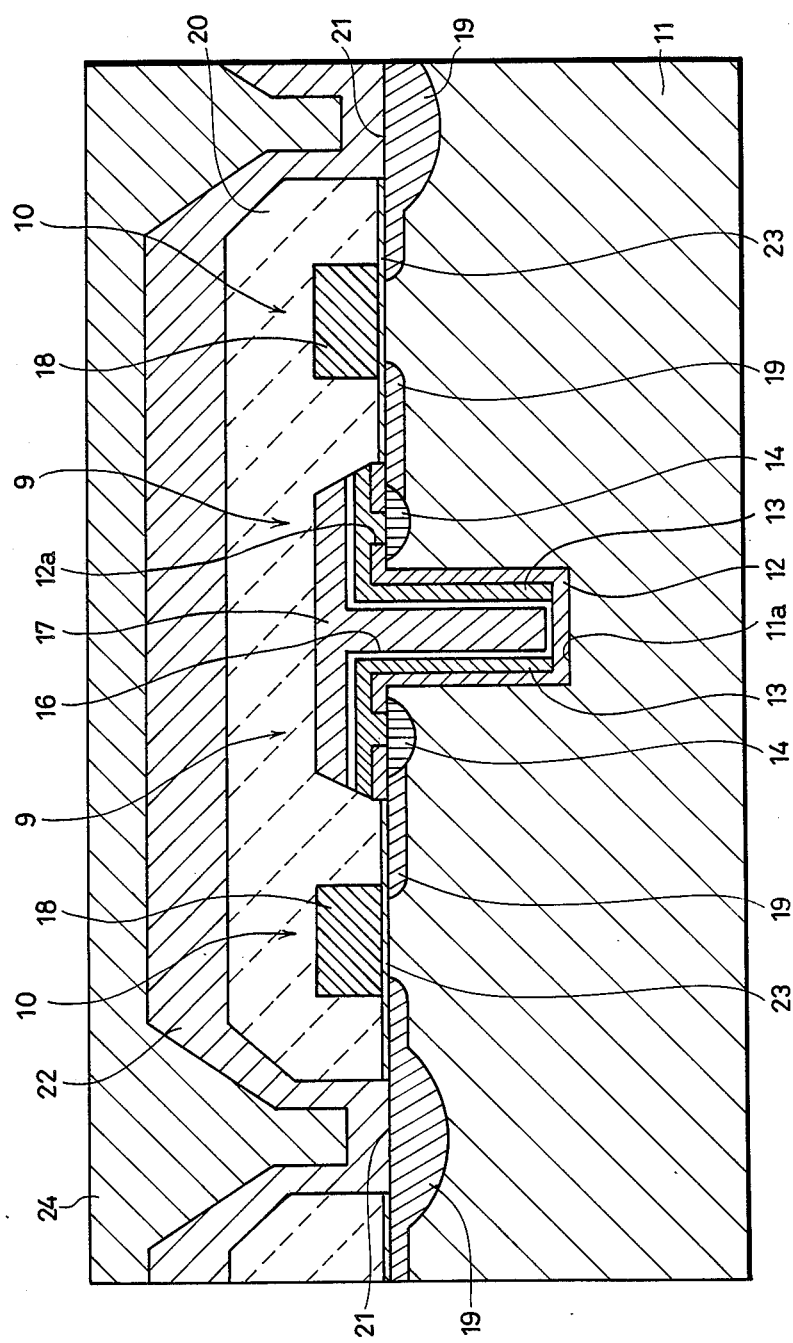
FIG. 1 is a schematic cross-sectional view of a semiconductor device having incorporated therein trench capacitor cells made according to this invention.

Referring now to FIG. 1, there are shown trench capacitor cells made in accordance with this invention. As illustrated, a semiconductor substrate 11 has a trench 11a formed in the upper surface thereof. An oxide layer 12 is deposited on the side and bottom walls of the trench 11a as well as over the substrate surface in an area surrounding the trench. A first level polysilicon layer 13 of a conductivity type opposite the substrate is positioned over the entire oxide layer 12 except at the trench bottom. The polysilicon is removed at the trench bottom to isolate two parts of the polysilicon layer 13 apart at the bottom. Diffusion regions 14 are provided in the substrate surface near the trench 11a and have a conductivity type different from the substrate. The underlying oxide layer 12 has contact holes 12a formed at locations over the diffusion regions 14. Through these holes 12a, the polysilicon layer 13 makes contact with the diffusion regions 14. A relatively thin layer of capacitor gate insulation 16 is formed over the polysilicon layer 13 and on the trench bottom. A second level polysilicon 17 containing conductive impurity ion overlies the gate insulation layer 16 and fills up the trench.

With this arrangement, a pair or capacitor cells 9 are formed and isolated from each other within the trench. Provided on the substrate 11 adjacent to the capacitor cells 9 are switching transistors 10.

Each switching transistor 10 comprises a transfer gate 18 formed on the substrate and a source-drain regions 19 produced in the substrate surface on both sides of the transfer gate 18. The transfer gate 18 forms part of word lines (not shown). As can be seen in FIG. 1, one of the source-drain regions 9 is in contact with the diffusion region 14, while the other source-drain region 19 with a bit line 22 at a contact opening 21. A transfer gate insulation layer 23 is provided on the substrate surface and the transfer gate 18.

An insulating layer 20 covers the capacitor cells 9 and switching transistors 10. A bit line 22 is formed to extend on this insulating layer 20, both of which are coated with a passivation layer 24.

In the trench capacitor cell construction of FIG. 1, polysilicon layers 13 and 17 which serve as capacitor electrodes or plates are formed along the side walls of the etched trench. A three dimensional capacitor is thus fabricated on the walls of the trench and has an increased charge storage capacity. The current trend in the IC technology toward higher component density has been making small the size of a planar capacitor to a possible minimum with a corresponding reduction in its charge storing capacity. In contrast, the trench capacitor cell of the invention extends generally vertically into the substrate, occupying only a small fraction of the substrate area while affording much higher storage capacity than the conventional planar cell. This feature of the present trench capacitor cell makes it extremely adaptable to and suitable for use in high density dynamic MOS memories. With regard to the problem of the soft errors caused by α-particles, of electron-hole pairs produced within the substrate by α-radiation, electrons affect the charge storing polysilicon layers 13 and 17 only through the contact holes 12a, that is, a very small number of electrons can reach the polysilicon layers via the contact holes. The trench capacitor cell made according to this invention is thus highly immune to the soft errors.

Figure 2A:
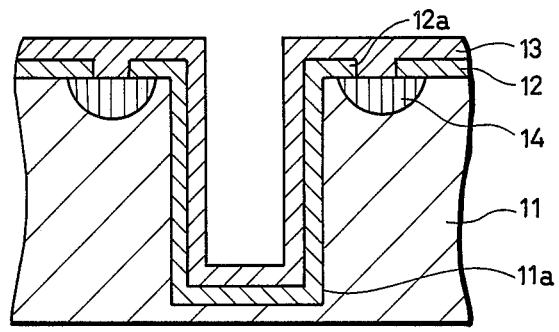
FIGS. 2A-2H are schematic cross-sectional views of trench capacitor cells at successive stages in the manufacturing method according to this invention.
Figure 2B:
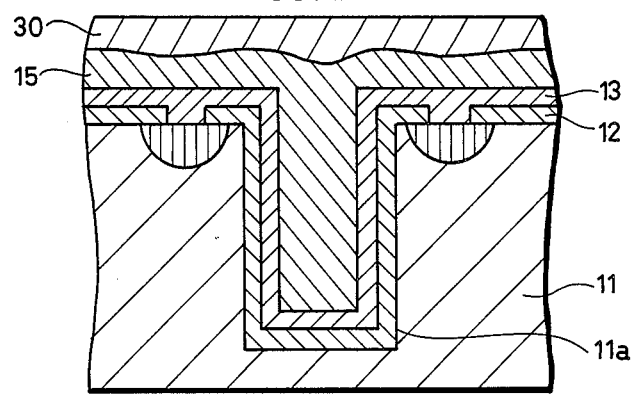
Figure 2C:
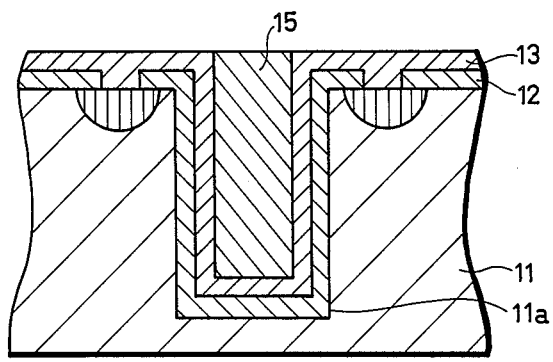
Figure 2D:
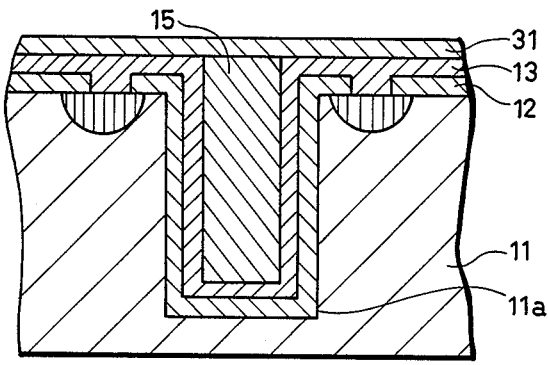
Figure 2E:
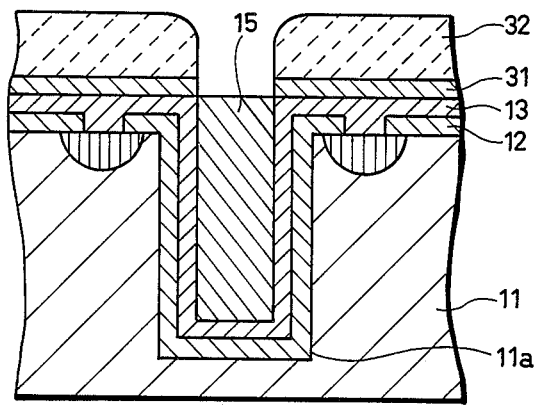

Now a novel method for fabricating the trench capacitor cell in accordance with this invention is described having reference to FIGS. 2A-2F. As shown in FIG. 2A, fabrication begins with making a trench 11a in a semiconductor substrate 11 by means of anisotropic etching. Then, an oxide layer 12 is deposited over the upper surface of the substrate 1 and on the walls of the trench 11a by means of high temperature thermal oxidation, followed by the formation of contact holes 12a in the oxide layer 12 at predetermined locations. Impurity ions are implanted through the contact holes 12a into the substrate 11 to form diffusion regions 14 in the substrate surface. Note that the diffusion regions 14 have a conductivity type opposite the substrate 11. Applied next on the oxide layer 12 is a polysilicon layer 13 containing ions of the conductivity type opposite the substrate. As shown in FIG. 2B, another oxide layer 15 is coated over the polysilicon layer 13 and filled within the trench 12a by means of high temperature thermal oxidation. A resist 30 is applied over the second level oxide layer 15 and planarized. Thereafter, both the resist 30 and the oxide layer 15 are etched away from the substrate, leaving only the portion of the oxide layer 15 that lies within the trench 11a as shown in FIG. 2C. Upon this etching step, the polysilicon layer 13 is exposed on the substrate surface. Next, a second level polysilicon layer 31 is deposited over the substrate (FIG. 2D). As shown in FIG. 2E, a resist 32 is applied over the second level polysilicon layer 31. Through mask and etch, the resist 32 is remove only at the portion thereof immediately above the trench 11a. Using the resist 32 as the mask, the underlying polysilicon layer 31 is stripped selectively over the trench.

Figure 2F:
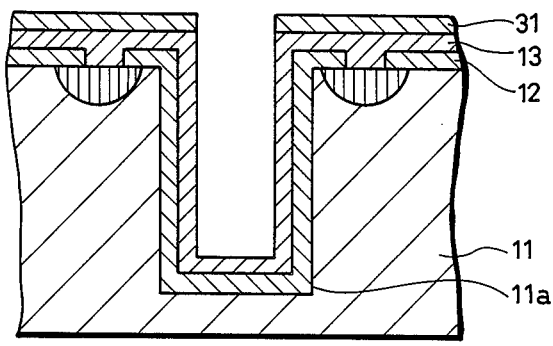
Figure 2G:
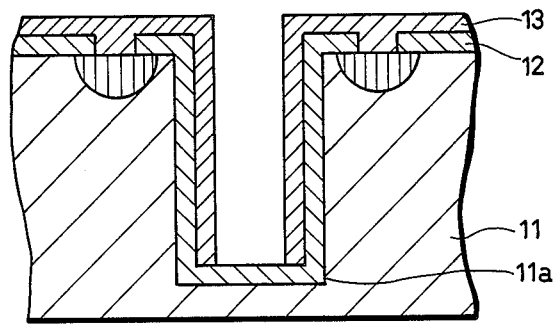

The next step in the fabrication process is to remove successively the resist 32 and that portion of the oxide layer 15 filled within the trench 11a (FIG. 2F). With the resist and the oxide filling thus removed, the substrate structure is subjected to anisotropic etching to strip the polysilicon layer 13 away from the trench bottom for devise isolation. As is obvious to those skilled in the art, anisotropic etching selectively eats horizontally extending portions of the polysilicon layer 13. When the anisotropic etching was performed without the overlying polysilicon layer 31, not only the portion of the polysilicon layer 13 that lies on the trench bottom but also the portion thereof overlying the substrate upper surface might be etched away. Note that the horizontally extending polysilicon layer 13 except for a part thereof in the trench should be kept intact during anisotropic etching. The overlying polysilicon layer 31 effectively protects the horizontally extending polysilicon layer 13 against etching although the second level polysilicon 31 itself is eaten away. In this sense, the second level polysilicon layer 31 functions as a temporal mask or "pseudo-mask" to shield the underlying polysilicon layer 13 from anisotropic etching. In order for the second level polysilicon layer 31 to serve as the "pseudo-mask" for the first level polysilicon layer 13, it should have a thickness or vertical dimension at least equal to or preferably slightly greater than that of the second level polysilicon layer 13 on the bottom of the trench. Otherwise, the pseudo-mask polysilicon is etched away before the underlying polysilicon 13 is completely removed at the trench bottom, resulting in the failure of devise isolation. In view of the pseudo mask function of the layer 31, it may also suitably be made of amorphous silicon or silicon nitride.

Figure 2H:
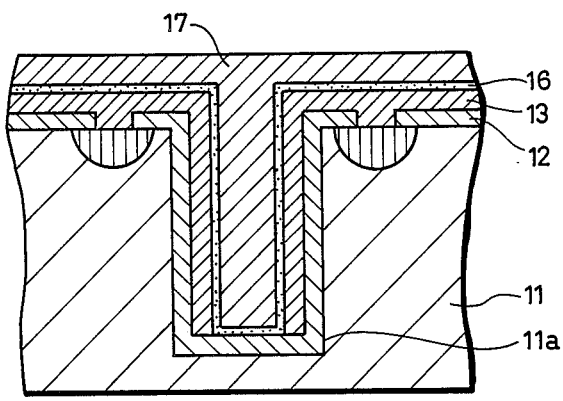
Figure 3A:
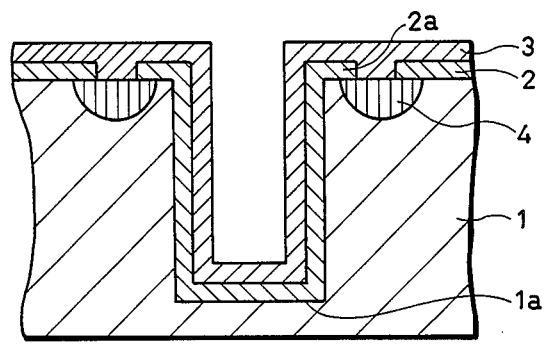
FIGS. 3A-3F are schematic cross-sectional views showing successive stages of a typical prior art process for a manufacturing trench capacitor cells.
Figure 3B:
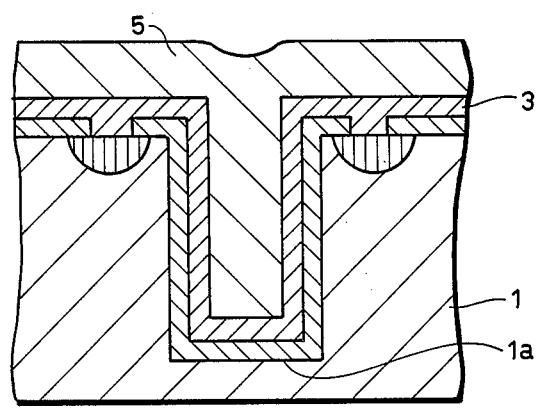
Figure 3C:
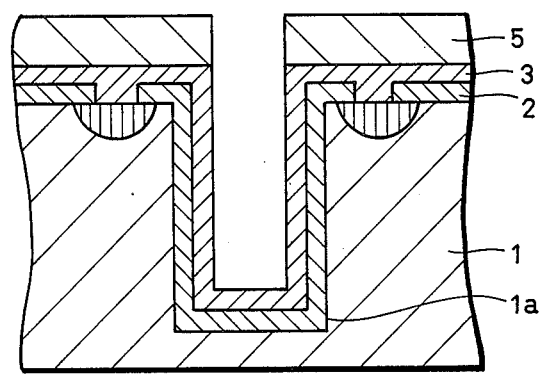
Figure 3D:
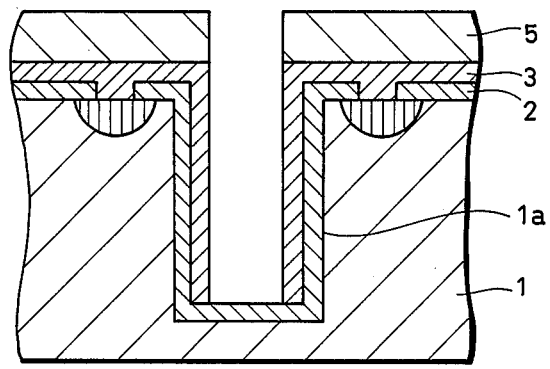
Figure 3E:
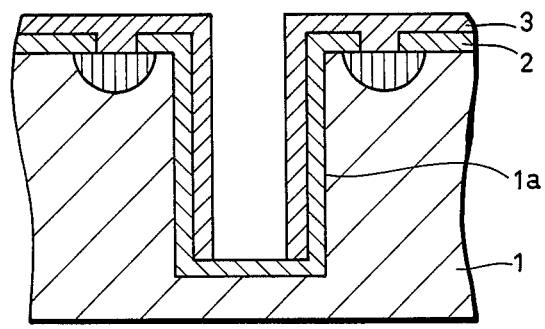
Figure 3F:
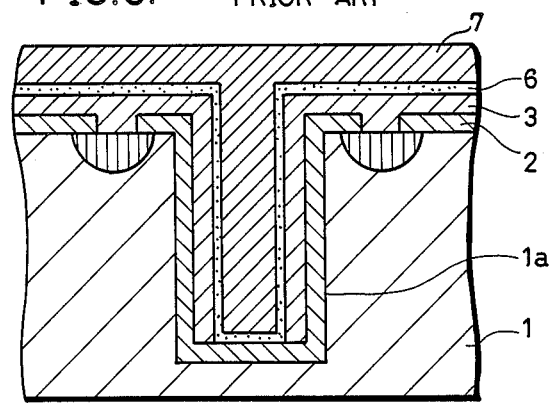

In FIG. 2H, the exposed surface of the polysilicon layer 13 is partially oxidized to form a thin capacitor gate insulation 16. A polysilicon layer 17 is developed over the insulation layer 16 and filled within the trench 11a to complete a capacitor cell 9 of FIG. 1 with the polysilicon layer 17 forming the cell plate.

In order to fabricate the switching transistor 10, a transfer gate insulation 23 is provided by thermal oxidation. The transfer gate 18 is formed of an electrode material on the insulation 23 by deposition and patterning. A source-drain region 19 is produced in the substrate surface on both sides of the transfer gate 18 by diffusing impurity ions of a conductivity type opposite the substrate.

Thereafter, the insulating layer 20 is applied over the substrate and patterned to define contact holes 21. A thin layer of conductor is then coated over the substrate and patterned to form a bit line 22 and a word line (not shown). Finally, a passivation layer 24 is coated over the entire surface to complete a semiconductor device of FIG. 1.

As is apparent from the foregoing detailed description of the invention, the trench cell isolation at the bottom of the trench is effectively performed by anisotropic etching using the second level polysilicon as a pseudo-mask for the protection of the underlying horizontally extending polysilicon. With the pseudo-mask of the second level polysilicon 31 positioned on the portion of the underlying first level polysilicon 13 extending over the substrate upper surface, the portion of the first level polysilicon 13 lying horizontally on the trench bottom is removed in a self-alignment manner during the anisotropic etching. Upon completion of the anisotropic etching, the first level polysilicon layer 13 is separated at the trench bottom, thereby realizing the desired trench cell isolation. In sharp contrast to the prior art process, the novel method of this invention does not rely on the resist coating for the device separation by means of anisotropic etching. As a result, the trench in the substrate is kept free of any presence of the resist material. There is no possibility whatsoever that the anisotropic etching step for the device separation within the trench will be adversely affected by the presence of the resist material as in the prior art. Thus, a highly reliable device separation is assured according to the method of this invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a trench capacitor cell for a semiconductor device comprising the steps of:
   forming a trench in a semiconductor substrate;
   forming a first insulating layer and a first conductor layer successively on the side and bottom walls of said trench;
   filling said trench with a second insulating layer;
   coating the surface of said substrate with a layer of mask made of a material that can be removed by subsequent etching procedure for removing said first conductor layer;
   selectively removing the part of said mask lying over said second insulating layer;
   removing said second insulating layer out of said trench;
   selectively removing the part of said first conductor layer lying on the bottom of said trench and said mask by etching procedure; and
   filling said trench successively with a third insulating layer and a second conductor layer.

2. A method of fabricating a trench capacitor cell for a semiconductor device according to claim 1 wherein said step of filling said trench with said second insulating layer includes:
   forming said second insulating layer over the surface of said substrate;
   covering said second insulating layer with a coating of resist having a plane upper surface; and
   removing said resist coating and said second insulating layer to leave said second insulating layer only within said trench.

3. A method of fabricating a trench capacitor cell for a semiconductor device according to claim 2 wherein said step of selectively removing the part of said mask lying over said second insulating layer includes:
   covering said mask with a resist coating;
   patterning said resist coating to expose the part of said mask overlying said second insulating layer;
   selectively etching said second insulating layer through said resist coating; and
   removing said resist.

4. A method of fabricating a trench capacitor cell for a semiconductor device according to claim 3 wherein said step of forming said insulating layer and said first conductor layer includes:
   forming said first insulating layer and said first conductor layer on the side and bottom walls of said trench and over said surface of said substrate in an area surrounding said trench;
   forming at least one diffusion region in said surface of said substrate under said first insulating layer;
   forming a contact hole in said first insulating layer at a location over said diffusion layer;
   whereby said first conductor layer makes contact with said diffusion region through said contact hole.

5. A method of fabricating a trench capacitor cell for a semiconductor device according to claim 4 wherein said step of selectively removing the part of said first conductor layer from the bottom of said trench and said mask is performed by anisotropic etching.

6. A method of fabricating a trench capacitor cell for a semiconductor device according to claim 1 wherein said mask is formed of a material selected from the group consisting of polysilicon, amorphous silicon and silicon nitride.

7. A method of fabricating a trench capacitor cell for a semiconductor device according to claim 1 wherein said second insulating layer is a silicon oxide layer.

* * * * *